(12) United States Patent
Seo et al.

(10) Patent No.: US 10,819,018 B2
(45) Date of Patent: Oct. 27, 2020

(54) CONDUCTIVE STRUCTURE DISPOSED TO CORRESPOND TO ANTENNA MODULE AND ELECTRONIC DEVICE INCLUDING THE SAME

(71) Applicant: Samsung Electronics Co., Ltd., Suwon-si, Gyeonggi-do (KR)

(72) Inventors: Seunghan Seo, Suwon-si (KR); Seunggil Jeon, Suwon-si (KR); Sungchul Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/573,290

(22) Filed: Sep. 17, 2019

(65) Prior Publication Data

US 2020/0144698 A1    May 7, 2020

(30) Foreign Application Priority Data

Nov. 6, 2018  (KR) .......................... 10-2018-0135260

(51) Int. Cl.
| | | |
|---|---|---|
| *H01Q 1/38* | (2006.01) | |
| *H01Q 1/24* | (2006.01) | |
| *H05K 1/18* | (2006.01) | |
| *H01Q 3/26* | (2006.01) | |

(52) U.S. Cl.
CPC .............. *H01Q 1/243* (2013.01); *H01Q 1/38* (2013.01); *H01Q 3/26* (2013.01); *H05K 1/189* (2013.01); *H05K 2201/10098* (2013.01)

(58) Field of Classification Search
None
See application file for complete search history.

(56) References Cited

U.S. PATENT DOCUMENTS

| | | | | |
|---|---|---|---|---|
| 7,391,372 B2 * | 6/2008 | Lynch | ................. | H01Q 9/0457 |
| | | | | 343/700 MS |
| 8,633,857 B2 * | 1/2014 | Wang | ................. | H01Q 1/2266 |
| | | | | 343/700 MS |
| 9,609,094 B2 * | 3/2017 | Yamashita | .......... | H04M 1/0202 |
| 9,666,934 B2 * | 5/2017 | Lombardi | ............. | H01Q 1/243 |
| 9,667,762 B1 * | 5/2017 | Takahashi | ............ | H04B 1/3888 |
| 10,256,872 B2 * | 4/2019 | Jiang | .................... | H04B 7/0408 |
| 10,461,793 B2 * | 10/2019 | Lee | ........................ | H01Q 13/10 |
| 10,516,201 B2 * | 12/2019 | Khripkov | ................ | H01Q 1/38 |

(Continued)

FOREIGN PATENT DOCUMENTS

KR   10-2018-0079012 A    7/2018

*Primary Examiner* — Tuan A Tran
(74) *Attorney, Agent, or Firm* — Jefferson IP Law, LLP

(57) ABSTRACT

An electronic device is provided. The electronic device includes a housing including a first plate facing in a first direction, a second plate opposite to the first plate and facing in a second direction, and a side member enclosing a space between the first plate and the second plate, an antenna structure including at least one antenna element disposed substantially parallel to the second plate in the space and disposed to face the second plate, a conductive structure disposed in the space and including an opening, the antenna structure being disposed to at least partially overlap the opening when viewed from above the second plate, and a wireless communication circuit configured to form a directional beam through the at least one antenna element. In addition, various embodiments may be available.

20 Claims, 16 Drawing Sheets

(56) References Cited

U.S. PATENT DOCUMENTS

| | | | |
|---|---|---|---|
| 10,522,900 B2* | 12/2019 | Khripkov | H01Q 13/22 |
| 10,547,339 B2* | 1/2020 | Shiu | H01Q 1/2291 |
| 2012/0050123 A1* | 3/2012 | Wang | H01Q 1/2266 |
| | | | 343/767 |
| 2017/0019510 A1* | 1/2017 | Jeon | C25D 5/48 |
| 2017/0110787 A1 | 4/2017 | Ouyang et al. | |
| 2017/0201014 A1 | 7/2017 | Lee et al. | |
| 2018/0062256 A1* | 3/2018 | Kim | H01Q 21/08 |
| 2018/0191059 A1 | 7/2018 | Ko et al. | |

* cited by examiner

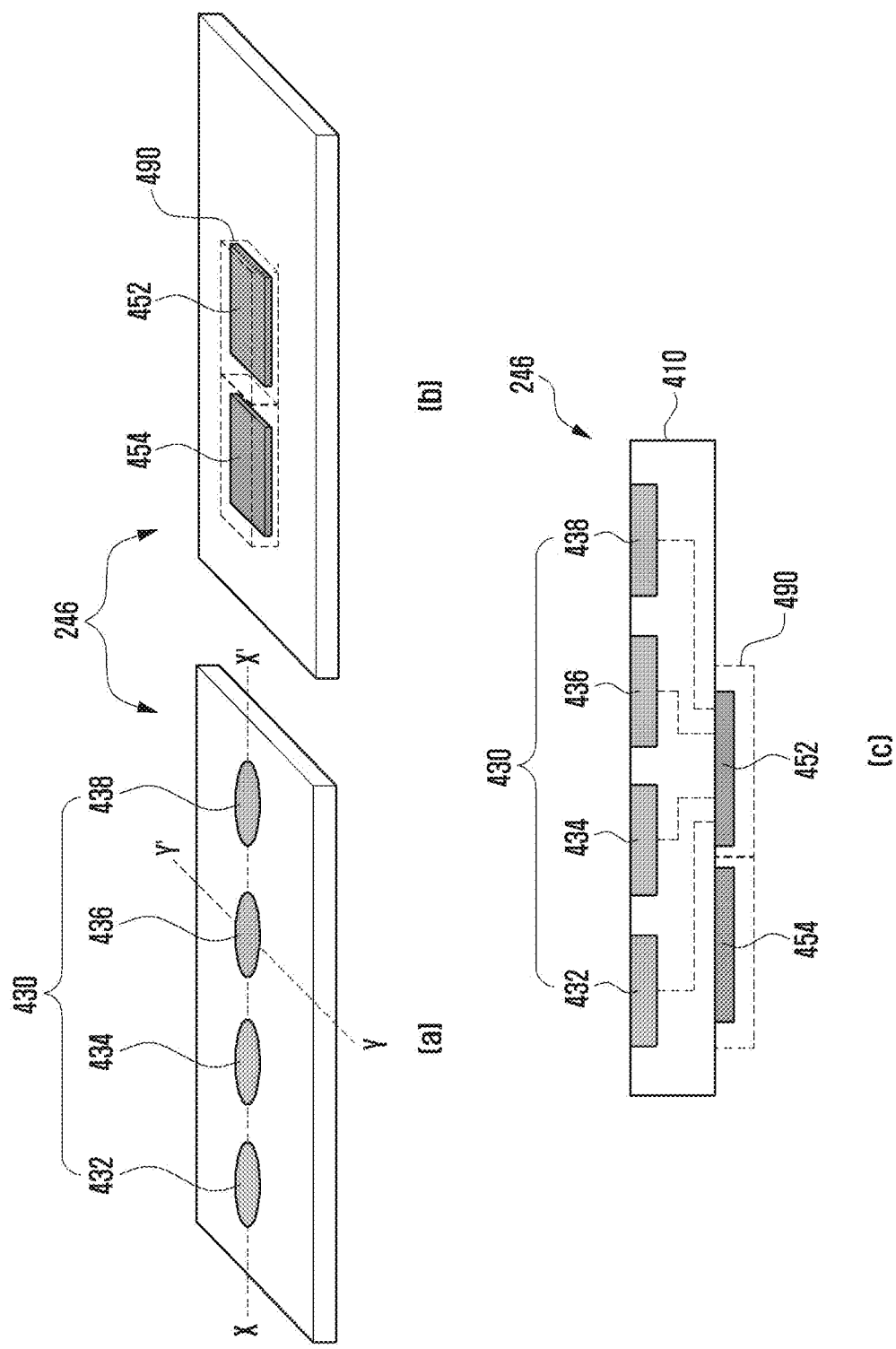

CONDUCTIVE STRUCTURE DISPOSED TO CORRESPOND TO ANTENNA MODULE AND ELECTRONIC DEVICE INCLUDING THE SAME

CROSS-REFERENCE TO RELATED APPLICATION(S)

This application is based on and claims priority under 35 U.S.C. 119(a) of a Korean patent application number 10-2018-0135260, filed on Nov. 6, 2018, in the Korean Intellectual Property Office, the disclosure of which is incorporated by reference herein in its entirety.

BACKGROUND OF THE INVENTION

1. Field

The disclosure relates to a conductive structure disposed to correspond to an antenna module and an electronic device including the same.

2. Description of the Related Art

With the development of wireless communication technology, electronic devices (e.g., communication electronic devices) are commonly used in daily life; thus, use of contents is increasing exponentially. Because of such rapid increase in the use of contents, a network capacity is reaching its limit. After commercialization of 4th generation (4G) communication systems, in order to meet growing wireless data traffic demand, a communication system (e.g., 5th generation (5G) or pre-5G communication system, or new radio (NR))) that transmits and/or receives signals using a frequency of a high frequency (e.g., millimeter wave (mmWave)) band (e.g., 3 GHz to 300 GHz band) is being studied.

Next generation wireless communication technology may transmit and receive signals using a frequency in a range of substantially about 3 GHz to about 100 GHz, and an efficient mounting structure for overcoming a high free space loss because of frequency characteristics and increasing a gain of an antenna as well as a new antenna structure corresponding thereto are being developed. The above-described antenna structure may include an antenna module in an array form in which various numbers of antenna elements are arranged at regular intervals. The antenna module may form a beam pattern on a planar printed circuit board through a cover plate (e.g., rear plate) provided as part of a housing for protecting internal electronic components of the electronic device and forming an external shape of the electronic device. The cover plate may be formed by any one of coated or colored glass, ceramic or polymeric materials or a combination of at least two thereof. Further, a cover plate and a double-sided tape member, a bracket, or a waterproof member having a specific dielectric constant and provided to an internal structure of the electronic device may be provided between the antenna module and an external space of the electronic device.

However, because a beam pattern formed by the antenna module is formed through a cover plate or an internal structure having a specific dielectric constant, there is a problem that a radiation performance lower than an original radiation performance is exhibited.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a conductive structure disposed to correspond to an antenna module and an electronic device including the same.

Another aspect of the disclosure is to provide a conductive structure disposed to correspond to an antenna module configured to prevent degradation of a radiation performance of the antenna module by various internal structures having a specific dielectric constant disposed in an electronic device, and an electronic device including the same.

Various embodiments of the disclosure may provide a conductive structure disposed to correspond to an antenna module configured to prevent degradation of a radiation performance without substantially providing an additional mounting space, and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first plate facing in a first direction, a second plate opposite to the first plate and facing in a second direction, and a side member enclosing a space between the first plate and the second plate, an antenna structure including at least one antenna element disposed substantially parallel to the second plate in the space and disposed to face the second plate, a conductive structure disposed in the space and including an opening and in which the antenna structure is disposed to at least partially overlap with at least the opening when viewed from above the second plate, and a wireless communication circuit configured to form a directional beam through the at least one antenna element.

In accordance with another aspect of the disclosure, an electronic device is provided. The electronic device includes a housing including a first plate facing in a first direction, a second plate opposite to the first plate and facing in a second direction, and a side member enclosing a space between the first plate and the second plate, an antenna structure including a plurality of antenna elements disposed substantially parallel to the second plate in the space and disposed to face the second plate, a conductive structure disposed through the second plate and including an opening and in which the plurality of antenna elements are disposed to at least partially overlap with at least the opening when viewed from above the second plate, and a wireless communication circuit configured to form a directional beam through the plurality of antenna elements.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the drawings, in which:

FIG. 4A is a diagram illustrating a structure of a third antenna module according to various embodiments of the disclosure;

Throughout the drawings, like reference numerals will be understood to refer to like parts, components, and structures.

DETAILED DESCRIPTION

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions are omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
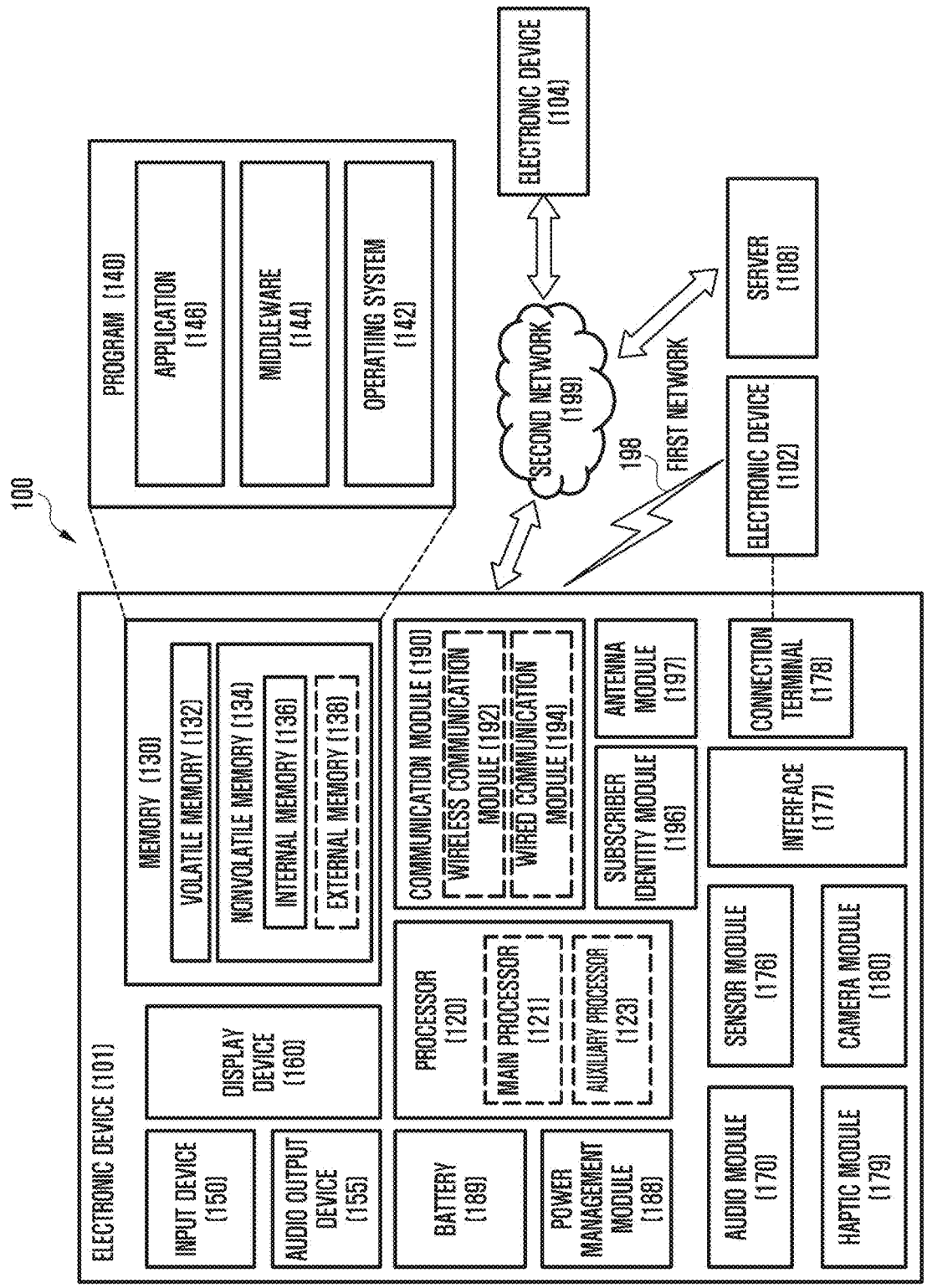
FIG. 1 is a block diagram illustrating a configuration of an electronic device in a network environment according to various embodiments of the disclosure.

FIG. 1 illustrates an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for an incoming calls. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a printed circuit board (PCB)). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "$1^{st}$" and "$2^{nd}$", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
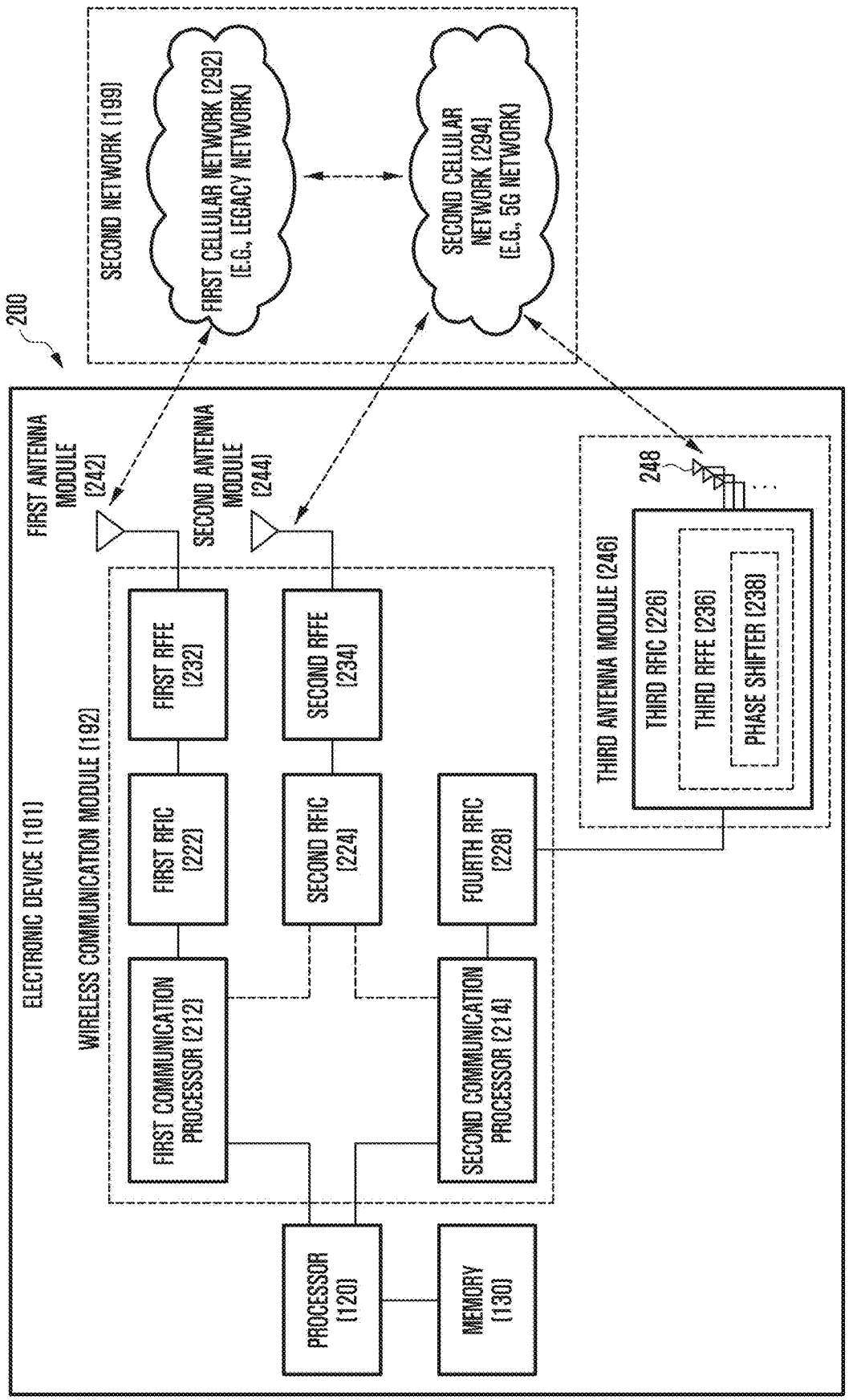
FIG. 2 is a block diagram illustrating a configuration of an electronic device in a network environment including a plurality of cellular networks according to various embodiments of the disclosure.

FIG. 2 is a block diagram illustrating an electronic device in a network environment including a plurality of cellular networks according to various embodiments of the disclosure.

Referring to FIG. 2, the electronic device 101 may include a first communication processor 212, second communication processor 214, first RFIC 222, second RFIC 224, third RFIC 226, fourth RFIC 228, first radio frequency front end (RFFE) 232, second RFFE 234, first antenna module 242, second antenna module 244, and antenna 248. The electronic device 101 may include a processor 120 and a memory 130. A second network 199 may include a first cellular network 292 and a second cellular network 294. According to another embodiment, the electronic device 101 may further include at least one of the components described with reference to FIG. 1, and the second network 199 may further include at least one other network. According to one embodiment, the first communication processor 212, second communication processor 214, first RFIC 222, second RFIC 224, fourth RFIC 228, first RFFE 232, and second RFFE 234 may form at least part of the wireless communication module 192. According to another embodiment, the fourth RFIC 228 may be omitted or included as part of the third RFIC 226.

The first communication processor 212 may establish a communication channel of a band to be used for wireless communication with the first cellular network 292 and support legacy network communication through the established communication channel. According to various embodiments, the first cellular network may be a legacy network including a second generation (2G), 3G; 4G; or long term evolution (LTE) network. The second communication processor 214 may establish a communication channel corresponding to a designated band (e.g., about 6 GHz to about 60 GHz) of bands to be used for wireless communication with the second cellular network 294, and support 5G network communication through the established communication channel. According to various embodiments, the second cellular network 294 may be a 5G network defined in 3GPP. Additionally, according to an embodiment, the first communication processor 212 or the second communication processor 214 may establish a communication channel corresponding to another designated band (e.g., about 6 GHz or less) of bands to be used for wireless communication with the second cellular network 294 and support 5G network communication through the established communication channel. According to one embodiment, the first communication processor 212 and the second communication processor 214 may be implemented in a single chip or a single package. According to various embodiments, the first communication processor 212 or the second communication processor 214 may be formed in a single chip or a single package with the processor 120, the auxiliary processor 123, or the communication module 190.

Upon transmission, the first RFIC 222 may convert a baseband signal generated by the first communication processor 212 to a radio frequency (RF) signal of about 700 MHz to about 3 GHz used in the first cellular network 292 (e.g., legacy network). Upon reception, an RF signal may be obtained from the first cellular network 292 (e.g., legacy network) through an antenna (e.g., the first antenna module 242) and be preprocessed through an RFFE (e.g., the first RFFE 232). The first RFIC 222 may convert the preprocessed RF signal to a baseband signal so as to be processed by the first communication processor 212.

Upon transmission, the second RFIC 224 may convert a baseband signal generated by the first communication processor 212 or the second communication processor 214 to an RF signal (hereinafter, 5G Sub6 RF signal) of a Sub6 band (e.g., 6 GHz or less) to be used in the second cellular network 294 (e.g., 5G network). Upon reception, a 5G Sub6 RF signal may be obtained from the second cellular network 294 (e.g., 5G network) through an antenna (e.g., the second antenna module 244) and be pretreated through an RFFE (e.g., the second RFFE 234). The second RFIC 224 may convert the preprocessed 5G Sub6 RF signal to a baseband signal so as to be processed by a corresponding communication processor of the first communication processor 212 or the second communication processor 214.

The third RFIC 226 may convert a baseband signal generated by the second communication processor 214 to an RF signal (hereinafter, 5G Above6 RF signal) of a 5G Above6 band (e.g., about 6 GHz to about 60 GHz) to be used in the second cellular network 294 (e.g., 5G network). Upon reception, a 5G Above6 RF signal may be obtained from the second cellular network 294 (e.g., 5G network) through an antenna (e.g., the antenna 248) and be preprocessed through the third RFFE 236. The third RFIC 226 may convert the preprocessed 5G Above6 RF signal to a baseband signal so as to be processed by the second communication processor 214. According to one embodiment, the third RFFE 236 may be formed as part of the third RFIC 226.

According to an embodiment, the electronic device 101 may include a fourth RFIC 228 separately from the third RFIC 226 or as at least part of the third RFIC 226. In this case, the fourth RFIC 228 may convert a baseband signal generated by the second communication processor 214 to an RF signal (hereinafter, an intermediate frequency (IF) signal) of an intermediate frequency band (e.g., about 9 GHz to about 11 GHz) and transfer the IF signal to the third RFIC 226. The third RFIC 226 may convert the IF signal to a 5G Above 6RF signal. Upon reception, the 5G Above 6RF signal may be received from the second cellular network 294 (e.g., a 5G network) through an antenna (e.g., the antenna 248) and be converted to an IF signal by the third RFIC 226. The fourth RFIC 228 may convert an IF signal to a baseband signal so as to be processed by the second communication processor 214.

According to one embodiment, the first RFIC 222 and the second RFIC 224 may be implemented into at least part of a single package or a single chip. According to one embodiment, the first RFFE 232 and the second RFFE 234 may be implemented into at least part of a single package or a single chip. According to one embodiment, at least one of the first antenna module 242 or the second antenna module 244 may be omitted or may be combined with another antenna module to process RF signals of a corresponding plurality of bands.

According to one embodiment, the third RFIC 226 and the antenna 248 may be disposed at the same substrate to form a third antenna module 246. For example, the wireless communication module 192 or the processor 120 may be disposed at a first substrate (e.g., main PCB). In this case, the third RFIC 226 is disposed in a partial area (e.g., lower surface) of the first substrate and a separate second substrate (e.g., sub PCB), and the antenna 248 is disposed in another partial area (e.g., upper surface) thereof; thus, the third antenna module 246 may be formed. By disposing the third RFIC 226 and the antenna 248 in the same substrate, a length of a transmission line therebetween can be reduced. This may reduce, for example, a loss (e.g., attenuation) of a signal of a high frequency band (e.g., about 6 GHz to about 60 GHz) to be used in 5G network communication by a transmission line. Therefore, the electronic device 101 may improve a quality or speed of communication with the second cellular network 294 (e.g., 5G network).

According to one embodiment, the antenna 248 may be formed in an antenna array including a plurality of antenna elements that may be used for beamforming. In this case, the third RFIC 226 may include a plurality of phase shifters 238 corresponding to a plurality of antenna elements, for example, as part of the third RFFE 236. Upon transmission, each of the plurality of phase shifters 238 may convert a phase of a 5G Above6 RF signal to be transmitted to the outside (e.g., a base station of a 5G network) of the electronic device 101 through a corresponding antenna element. Upon reception, each of the plurality of phase shifters 238 may convert a phase of the 5G Above6 RF signal received from the outside to the same phase or substantially the same phase through a corresponding antenna element. This enables transmission or reception through beamforming between the electronic device 101 and the outside.

The second cellular network 294 (e.g., 5G network) may operate (e.g., stand-alone (SA)) independently of the first cellular network 292 (e.g., legacy network) or may be operated (e.g., non-stand alone (NSA)) in connection with the first cellular network 292. For example, the 5G network may have only an access network (e.g., 5G radio access network (RAN) or a next generation (NG) RAN and have no core network (e.g., next generation core (NGC)). In this case, after accessing to the access network of the 5G network, the electronic device 101 may access to an external network (e.g., Internet) under the control of a core network (e.g., an evolved packed core (EPC)) of the legacy network. Protocol information (e.g., LTE protocol information) for communication with a legacy network or protocol information (e.g., new radio (NR) protocol information) for communication with a 5G network may be stored in the memory 130 to be accessed by other components (e.g., the processor 120, the first communication processor 212, or the second communication processor 214).

Figure 3A:
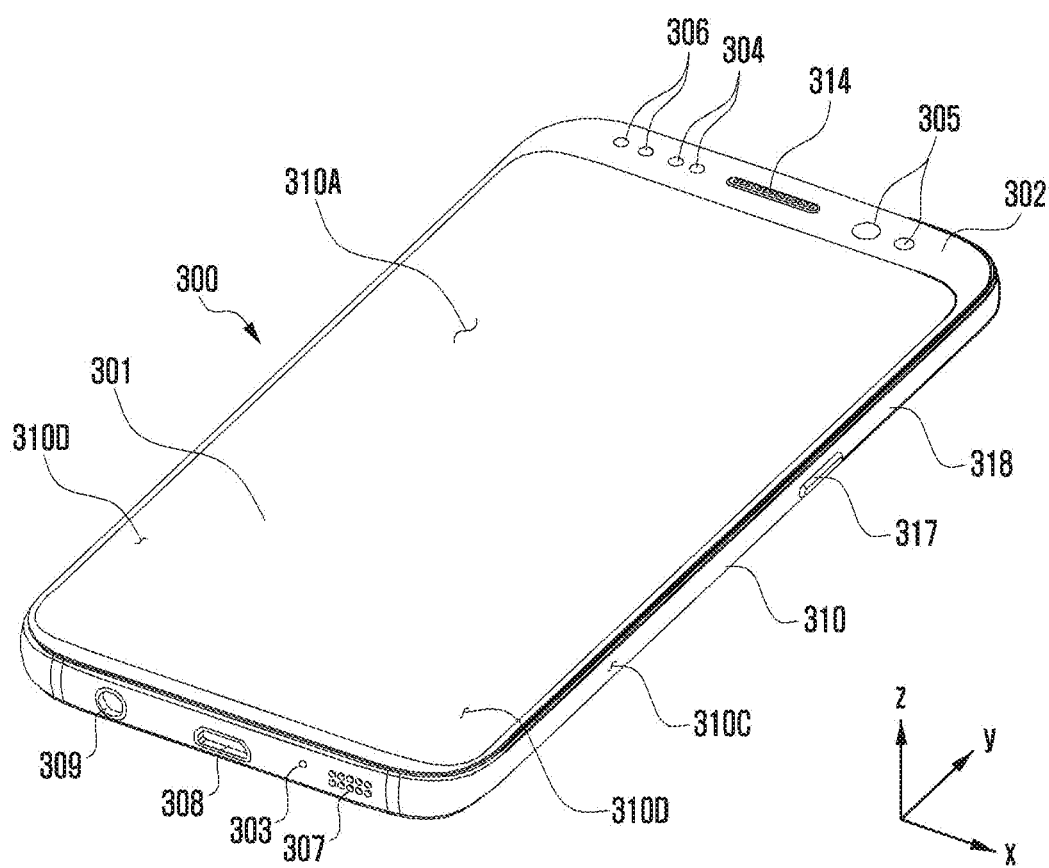
FIG. 3A is a perspective view illustrating a mobile electronic device according to various embodiments of the disclosure.

FIG. 3A is a front perspective view illustrating a mobile electronic device 300 according to various embodiments of the disclosure.

Figure 3B:
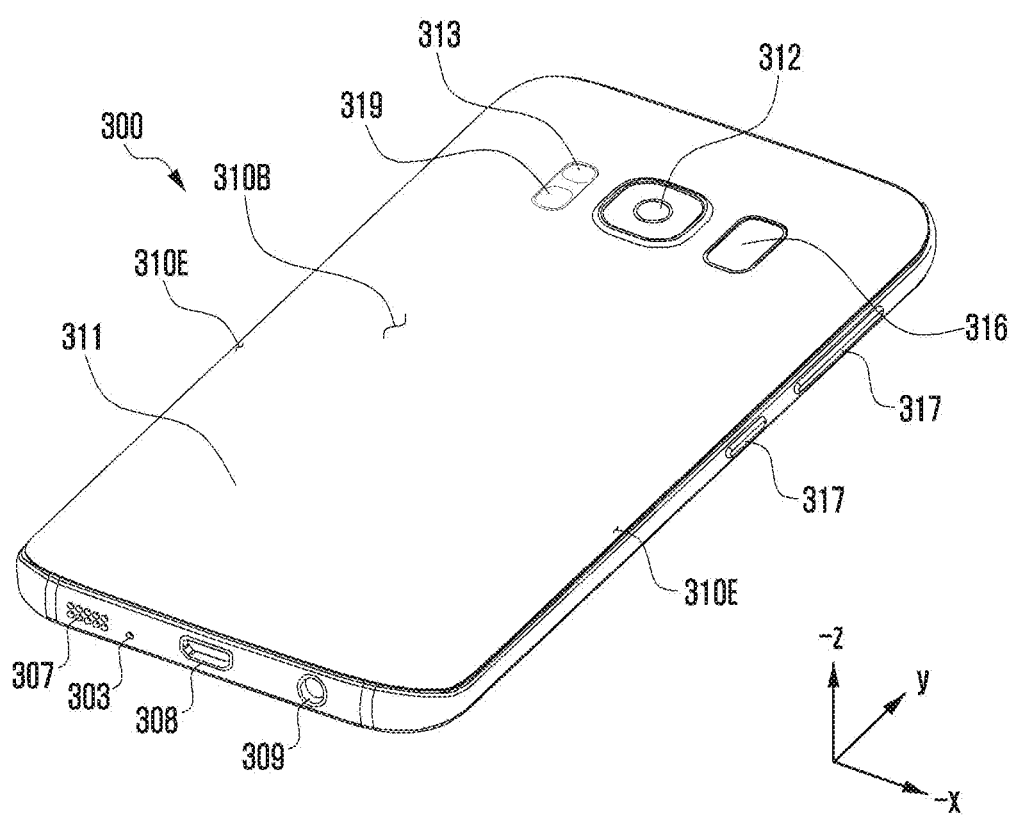
FIG. 3B is a rear perspective view illustrating a mobile electronic device according to various embodiments of the disclosure.

FIG. 3B is a rear perspective view illustrating a mobile electronic device 300 according to various embodiments of the disclosure.

Referring to FIGS. 3A and 3B, the mobile electronic device 300 (e.g., the electronic device 101 of FIG. 1) according to various embodiments may include a housing 310 including a first surface (or front surface) 310A, a second surface (or rear surface) 310B, and a side surface 310C enclosing a space between the first surface 310A and the second surface 310B. In one embodiment (not illustrated), the housing may refer to a structure forming some of the first surface 310A, the second surface 310B, and the side surface 310C. According to one embodiment, the first surface 310A may be formed by an at least partially substantially transparent front plate 302 (e.g., a polymer plate or a glass plate including various coating layers). The second surface 310B may be formed by a substantially opaque rear plate 311. The rear plate 311 may be formed by, for example, coated or colored glass, ceramic, polymer, metal (e.g., aluminum, stainless steel (STS), or magnesium), or a combination of at least two of the above materials. The side surface 310C may be coupled to the front plate 302 and the rear plate 311 and be formed by a side bezel structure (or "side member") 318 including a metal and/or a polymer. In some embodiments, the rear plate 311 and the side bezel structure 318 may be integrally formed and include the same material (e.g., metal material such as aluminum).

In the illustrated embodiment, the front plate 302 may include two first regions 310D bent and extended seamlessly from the first surface 310A toward the rear plate 311 at both ends of a long edge of the front plate 302. In the illustrated embodiment (see FIG. 3B), the rear plate 311 may include two second regions 310E bent and extended seamlessly from the second surface 310B towards the front plate 302 at both ends of a long edge. In some embodiments, the front plate 302 (or the rear plate 311) may include only one of the first regions 310D (or the second regions 310E). In one embodiment, a portion of the first regions 310D or the second regions 310E may not be included. In the above embodiments, when viewed from the side surface of the mobile electronic device 300, the side bezel structure 318 may have a first thickness (or width) at a side surface in which the first region 310D or the second region 310E is not included and have a second thickness smaller than the first thickness at a side surface including the first region 310D or the second region 310E.

According to one embodiment, the mobile electronic device 300 may include at least one of a display 301; audio modules 303, 307, and 314; sensor modules 304, 316, and 319; camera modules 305, 312, and 313; key input device 317; light emitting element 306; and connector holes 308 and 309. In some embodiments, the mobile electronic device 300 may omit at least one (e.g., the key input device 317 or the light emitting element 306) of the components or may further include other components.

The display 301 may be exposed through, for example, a substantial portion of the front plate 302. In some embodiments, at least part of the display 301 may be exposed through the front plate 302 forming the first region 310D of the side surface 310C and the first surface 310A. In some embodiments, an edge of the display 301 may be formed to be substantially the same as an adjacent outer edge shape of the front plate 302. In one embodiment (not illustrated), in order to enlarge an area where the display 301 is exposed, a distance between an outer edge of the display 301 and an outer edge of the front plate 302 may be formed to be substantially the same.

In an embodiment (not illustrated), in a portion of a screen display area of the display 301, a recess or an opening may be formed, and at least one of the audio module 314 and the sensor module 304, the camera module 305, and the light emitting element 306 aligned with the recess or the opening may be included. In one embodiment (not illustrated), at a rear surface of a screen display area of the display 301, at least one of the audio module 314, the sensor module 304, the camera module 305, the fingerprint sensor module 316, and the light emitting element 306 may be included. In one embodiment (not illustrated), the display 301 may be coupled to or disposed adjacent to a touch detection circuit, a pressure sensor capable of measuring intensity (pressure) of the touch, and/or a digitizer for detecting a stylus pen of a magnetic field method. In some embodiments, at least part of the sensor modules 304 and 319 and/or at least part of the key input device 317 may be disposed in a first region 310D and/or a second region 310E.

The audio modules 303, 307, and 314 may include a microphone hole 303 and speaker holes 307 and 314. The microphone hole 303 may dispose a microphone for obtaining an external sound therein; and, in some embodiments, a plurality of microphones may be disposed to detect a direction of a sound. The speaker holes 307 and 314 may include an external speaker hole 307 and a call receiver hole 314. In some embodiments, the speaker holes 307 and 314 and the microphone hole 303 may be implemented into one hole, or the speaker may be included without the speaker holes 307 and 314 (e.g., piezo speaker).

The sensor modules 304, 316, and 319 may generate an electrical signal or a data value corresponding to an operating state inside the mobile electronic device 300 or an environment state outside the mobile electronic device 300. The sensor modules 304, 316, and 319 may include, for example, a first sensor module 304 (e.g., proximity sensor) and/or a second sensor module (not illustrated) (e.g., fingerprint sensor), disposed at the first surface 310A of the housing 310, and/or a third sensor module 319 (e.g., a heart rate monitor (HRM) sensor) and/or a fourth sensor module 316 (e.g., fingerprint sensor), disposed at the second surface 310B of the housing 310. The fingerprint sensor may be disposed at the second surface 310B as well as the first surface 310A (e.g., the display 301) of the housing 310. The mobile electronic device 300 may further include a sensor module (not illustrated), for example, at least one of a gesture sensor, gyro sensor, air pressure sensor, magnetic sensor, acceleration sensor, grip sensor, color sensor, IR sensor, biometric sensor, temperature sensor, humidity sensor, and illumination sensor 304.

The camera modules 305, 312, and 313 may include a first camera device 305 disposed at the first surface 310A of the mobile electronic device 300, a second camera device 312 disposed at the second surface 310B thereof, and/or a flash 313. The camera modules 305 and 312 may include one or a plurality of lenses, an image sensor, and/or an image signal processor. The flash 313 may include, for example, a light emitting diode or a xenon lamp. In some embodiments, two or more lenses (infrared camera, wide angle and telephoto lens) and image sensors may be disposed at one surface of the mobile electronic device 300.

The key input device 317 may be disposed at the side surface 310C of the housing 310. In one embodiment, the mobile electronic device 300 may not include some or all of the above-described key input devices 317, and the key input device 317 that is not included may be implemented in other forms such as a soft key on the display 301. In some embodiments, the key input device 317 may include a sensor module 316 disposed at the second surface 310B of the housing 310.

The light emitting element 306 may be disposed at, for example, the first surface 310A of the housing 310. The light emitting element 306 may provide, for example, status information of the mobile electronic device 300 in an optical form. In one embodiment, the light emitting element 306 may provide, for example, a light source interworking with an operation of the camera module 305. The light emitting element 306 may include, for example, a light emitting diode (LED), an IR LED, and a xenon lamp.

The connector ports 308 and 309 may include a first connector port 308 that may receive a connector (e.g., a USB connector) for transmitting and receiving power and/or data to and from an external electronic device and/or a second connector hole (e.g., earphone jack) 309 that can receive a connector for transmitting and receiving audio signals to and from an external electronic device.

Figure 3C:
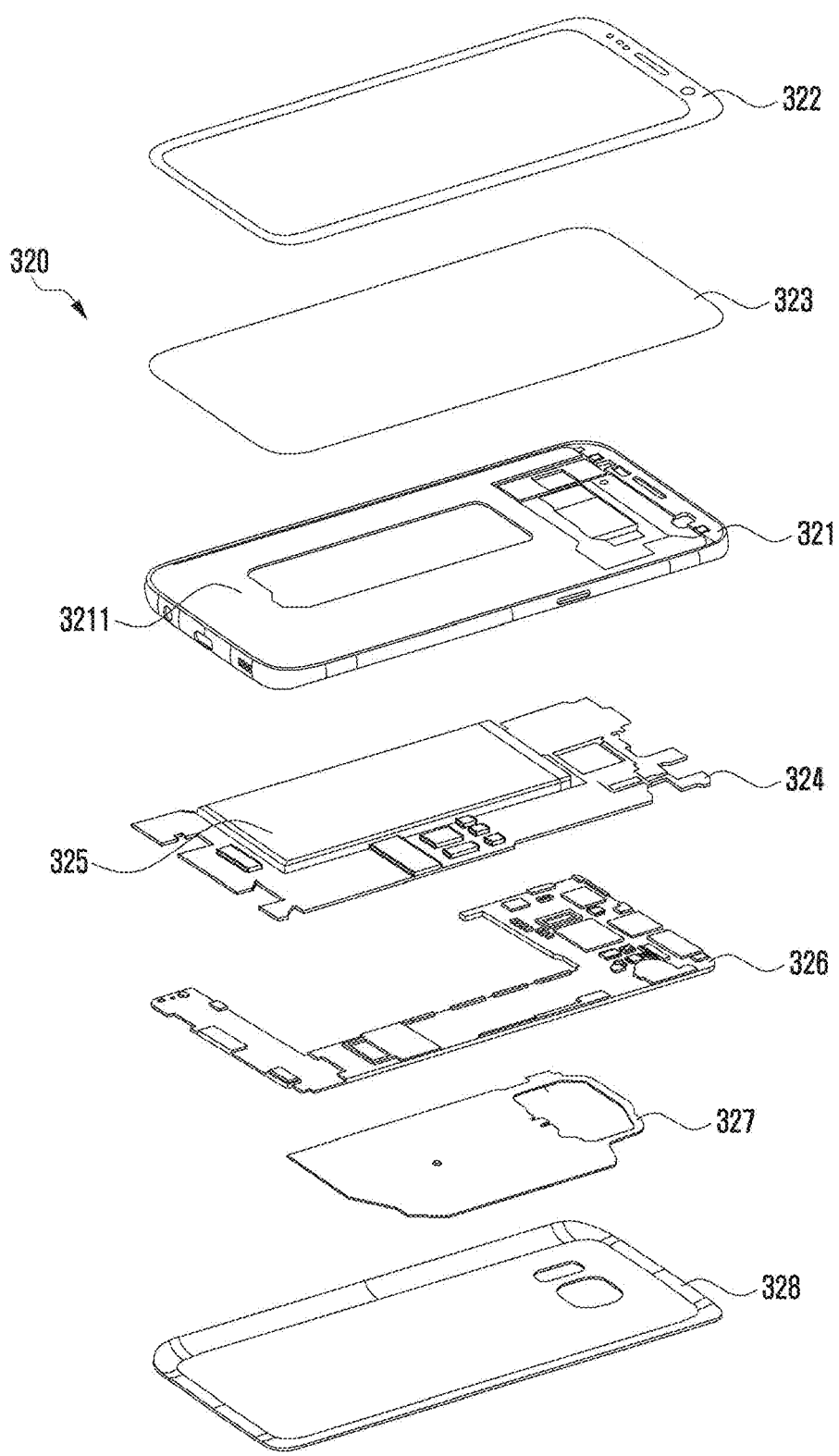
FIG. 3C is an exploded perspective view illustrating a mobile electronic device according to various embodiments of the disclosure.

FIG. 3C is an exploded perspective view illustrating a mobile electronic device according to various embodiments of the disclosure.

Referring to FIG. 3C, the mobile electronic device 320 (e.g., the mobile electronic device 300 of FIG. 3A) may include a side bezel structure 321, first support member 3211 (e.g., bracket), front plate 322, display 323, printed circuit board 324, battery 325, second support member 326 (e.g., rear case), antenna 327, and rear plate 328. In some embodiments, the electronic device 320 may omit at least one (e.g., the first support member 3211 or the second support member 326) of the components or may further include other components. At least one of the components of the electronic device 320 may be the same as or similar to at least one of the components of the mobile electronic device 300 of FIG. 3A or 3B and a duplicated description is omitted below.

The first support member 3211 may be disposed inside the electronic device 320 to be connected to the side bezel structure 321 or may be integrally formed with the side bezel structure 321. The first support member 3211 may be made of, for example, a metal material and/or a non-metal (e.g., polymer) material. In the first support member 3211, the display 323 may be coupled to one surface thereof, and the printed circuit board 324 may be coupled to the other surface thereof. In the printed circuit board 324, a processor, a memory, and/or an interface may be mounted. The processor may include, for example, one or more of a central processing unit, application processor, graphic processing unit, image signal processor, sensor hub processor, or communication processor.

The memory may include, for example, a volatile memory or a nonvolatile memory.

The interface may include, for example, a HDMI, USB interface, SD card interface, and/or audio interface. The interface may, for example, electrically or physically connect the electronic device 320 to an external electronic device and include a USB connector, an SD card/multimedia card (MMC) connector, or an audio connector.

The battery 325 is a device for supplying power to at least one component of the electronic device 320 and may include, for example, a non-rechargeable primary battery, a rechargeable secondary battery, or a fuel cell. At least part of the battery 325 may be disposed, for example, on substantially the same plane as that of the printed circuit board 324. The battery 325 may be integrally disposed inside the electronic device 320 or may be detachably disposed in the electronic device 320.

The antenna 327 may be disposed between the rear plate 328 and the battery 325. The antenna 327 may include, for example, a near field communication (NFC) antenna, wireless charging antenna, and/or magnetic secure transmission (MST) antenna. The antenna 327 may perform, for example, short range communication with an external device or may wirelessly transmit and receive power required for charging. In one embodiment, an antenna structure may be formed by some or a combination of the side bezel structure 321 and/or the first support member 3211.

FIG. 4A is a diagram illustrating a structure of, for example, a third antenna module described with reference to FIG. 2 according to various embodiments of the disclosure.

Referring to FIG. 4A(a) is a perspective view illustrating the third antenna module 246 viewed from one side, and FIG. 4A(b) is a perspective view illustrating the third antenna module 246 viewed from the other side. FIG. 4A(c) is a cross-sectional view illustrating the third antenna module 246 taken along line X-X' of FIG. 4A.

With reference to FIG. 4A, in one embodiment, the third antenna module 246 may include a printed circuit board 410, an antenna array 430, a RFIC 452, and a PMIC 454. Alternatively, the third antenna module 246 may further include a shield member 490. In other embodiments, at least one of the above-described components may be omitted or at least two of the components may be integrally formed.

The printed circuit board 410 may include a plurality of conductive layers and a plurality of non-conductive layers stacked alternately with the conductive layers. The printed circuit board 410 may provide electrical connections between the printed circuit board 410 and/or various electronic components disposed outside using wirings and conductive vias formed in the conductive layer.

The antenna array 430 (e.g., 248 of FIG. 2) may include a plurality of antenna elements 432, 434, 436, or 438 disposed to form a directional beam. As illustrated, the antenna elements 432, 434, 436, or 438 may be formed at a first surface of the printed circuit board 410. According to another embodiment, the antenna array 430 may be formed inside the printed circuit board 410. According to the embodiment, the antenna array 430 may include the same or a different shape or kind of a plurality of antenna arrays (e.g., dipole antenna array and/or patch antenna array).

The RFIC 452 (e.g., the third RFIC 226 of FIG. 2) may be disposed at another area (e.g., a second surface opposite to the first surface) of the printed circuit board 410 spaced apart from the antenna array. The RFIC 452 is configured to process signals of a selected frequency band transmitted/received through the antenna array 430. According to one embodiment, upon transmission, the RFIC 452 may convert a baseband signal obtained from a communication processor (not shown) to an RF signal of a designated band. Upon reception, the RFIC 452 may convert an RF signal received through the antenna array 430 to a baseband signal and transfer the baseband signal to the communication processor.

According to another embodiment, upon transmission, the RFIC 452 may up-convert an IF signal (e.g., about 9 GHz to about 11 GHz) obtained from an intermediate frequency integrate circuit (IFIC) (e.g., 228 of FIG. 2) to an RF signal of a selected band. Upon reception, the RFIC 452 may down-convert the RF signal obtained through the antenna array 430, convert the RF signal to an IF signal, and transfer the IF signal to the IFIC.

The PMIC 454 may be disposed in another partial area (e.g., the second surface) of the printed circuit board 410 spaced apart from the antenna array 430. The PMIC 454 may receive a voltage from a main PCB (not illustrated) to provide power necessary for various components (e.g., the RFIC 452) on the antenna module.

The shielding member 490 may be disposed at a portion (e.g., the second surface) of the printed circuit board 410 so as to electromagnetically shield at least one of the RFIC 452 or the PMIC 454. According to one embodiment, the shield member 490 may include a shield can.

Although not shown, in various embodiments, the third antenna module 246 may be electrically connected to another printed circuit board (e.g., main circuit board) through a module interface. The module interface may include a connecting member, for example, a coaxial cable connector, board to board connector, interposer, or flexible printed circuit board (FPCB). The RFIC 452 and/or the PMIC 454 of the antenna module may be electrically connected to the printed circuit board through the connection member.

Figure 4B:
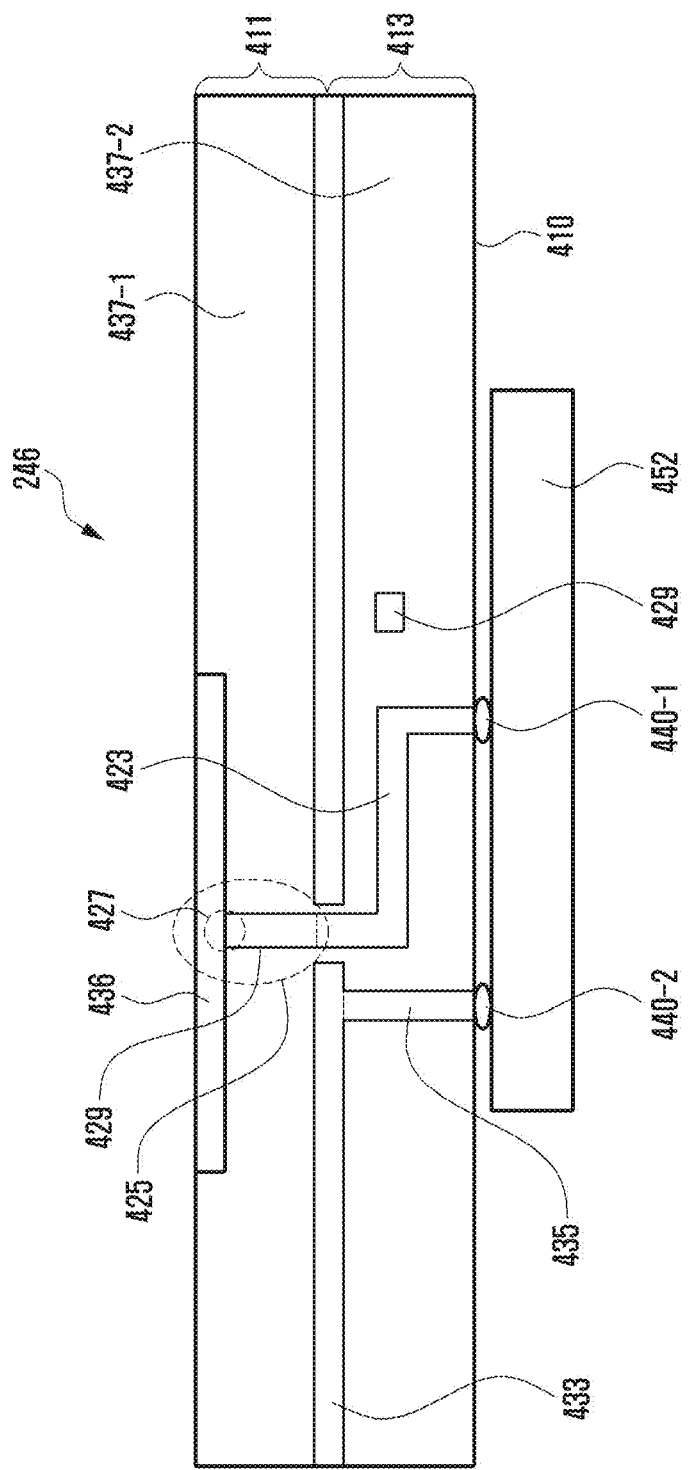
FIG. 4B is a cross-sectional view illustrating the third antenna module taken along line Y-Y' of FIG. 4A(a) according to various embodiments of the disclosure.

FIG. 4B is a cross-sectional view illustrating the third antenna module 246 taken along line Y-Y' of FIG. 4A(a) according to various embodiments of the disclosure. The printed circuit board 410 of the illustrated embodiment may include an antenna layer 411 and a network layer 413.

With reference to FIG. 4B, the antenna layer 411 may include at least one dielectric layer 437-1, and an antenna element 436 and/or a power feeding portion 425 formed on or inside an outer surface of a dielectric layer. The power feeding portion 425 may include a power feeding point 427 and/or a power feeding line 429.

The network layer 413 may include at least one dielectric layer 437-2, at least one ground layer 433, at least one conductive via 435, a transmission line 423, and/or a power feeding line 429 formed on or inside an outer surface of the dielectric layer.

Further, in the illustrated embodiment, the RFIC 452 (e.g., the third RFIC 226 of FIG. 2) of FIG. 4A(c) may be electrically connected to the network layer 413 through, for example, first and second solder bumps 440-1 and 440-2. In other embodiments, various connection structures (e.g., solder or ball grid array (BGA)) instead of the solder bumps may be used. The RFIC 452 may be electrically connected to the antenna element 436 through the first solder bump 440-1, the transmission line 423, and the power feeding portion 425. The RFIC 452 may also be electrically connected to the ground layer 433 through the second solder bump 440-2 and the conductive via 435. Although not illustrated, the RFIC 452 may also be electrically connected to the above-described module interface through the power feeding line 429.

Figure 5:
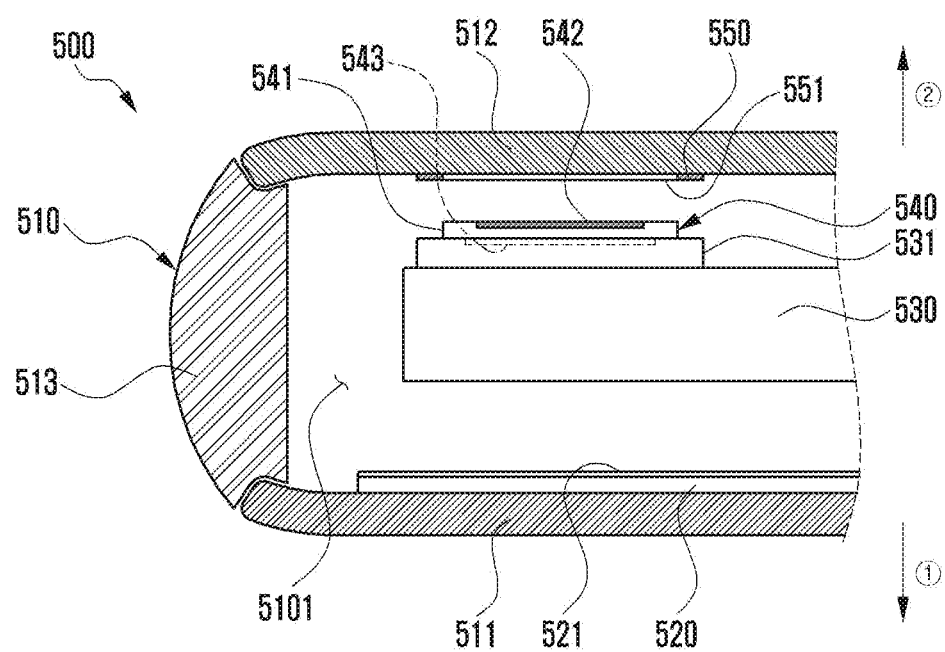
FIG. 5 is a partial cross-sectional view illustrating an electronic device according to various embodiments of the disclosure.

FIG. 5 is a partial cross-sectional view illustrating an electronic device according to various embodiments of the disclosure.

Referring to FIG. 5, the electronic device 500 may be at least partially similar to the mobile electronic device 300 of FIG. 3A or may include other examples of the electronic device.

An antenna module 540 of FIG. 5 may be at least partially similar to the third antenna module 246 of FIG. 2 or may include other examples of the antenna module.

With reference to FIG. 5, the electronic device 500 may include a housing 510 including a first plate 511 facing in a first direction (i.e., the (1) direction) (e.g., z direction of FIG. 3A), a second plate 512 opposite to the first plate 511 and facing in a second direction (i.e., the (2) direction) (e.g., −z direction of FIG. 3A), and a side member 513 enclosing a space 5101 between the first plate 511 and the second plate 512. According to one embodiment, the second plate 512 may be formed by any one of coated or colored glass, ceramic or polymeric materials or a combination of at least two thereof. According to one embodiment, the first plate 511 and/or the second plate 512 may include only a flat portion or may include a flat portion and a curved portion extended from the flat portion. According to one embodiment, the electronic device 500 may include a display 520 disposed to be visible from the outside through at least a partial area of the first plate 511 in the internal space 5101. According to one embodiment, the display 520 may include a flexible touch screen display. According to one embodiment, the display 520 may include a conductive plate 521 disposed for noise shielding and insulation. According to one embodiment, the conductive plate 521 may include a copper (Cu) sheet of an adhesive film form.

According to various embodiments, the electronic device 500 may include an antenna module 540 disposed in the internal space 5101. According to one embodiment, the antenna module 540 may include an antenna array 542 including, as an antenna structure, a substrate 541 and at least one antenna element (e.g., antenna elements 5421, 5422, 5423 of FIG. 6A) disposed at the substrate 541. According to one embodiment, the antenna module 540 may include a wireless communication circuit 543 disposed at the substrate 541 and electrically connected to the antenna array 542. According to one embodiment, the wireless communication circuit 543 may be configured to transmit and/or receive a signal having a frequency of at least some bands (e.g., from about 24 GHZ to about 30 GHZ or from about 37 GHz to about 40 GHz) among bands of about 3 GHz to about 100 GHz through the antenna array 542.

According to various embodiments, the antenna module 540 may be disposed at a device substrate 530 (e.g., the printed circuit board 324 of FIG. 3C) through a support member 531 in the internal space 5101 of the electronic device 500. According to one embodiment, the support member 531 may include an interposer for electrically connecting the antenna module 540 to the device substrate 530. In another embodiment, the antenna module 540 may be directly mounted in the device substrate 530. In another embodiment, the antenna module 540 may be disposed to be supported by a specific structure in the internal space 5101 of the electronic device 500 and be configured to be electrically connected to the device substrate 530 through a conductive cable (e.g., FPCB).

According to various embodiments, when viewed from above the second plate 512, the electronic device 500 may include a conductive structure 550 (e.g., conductive lens) disposed between the antenna module 540 and the second plate 512 at a position overlapped with the antenna module 540. According to one embodiment, the antenna module 540 may prevent a radiation performance of a beam pattern formed from the antenna array 542 from being lowered by the conductive structure 550. According to one embodiment, the conductive structure 550 may be configured in the form of a closed loop in which an opening 551 is formed at the center. According to one embodiment, when viewed from above the second plate 512, the antenna module 540 may be disposed at a position overlapped with the opening 551. According to one embodiment, by refracting and/or reflecting a wireless signal transmitted and/or received from the antenna module 540, the conductive structure 550 may compensate distortion of a radiation performance by the second plate 512.

Figure 6A:
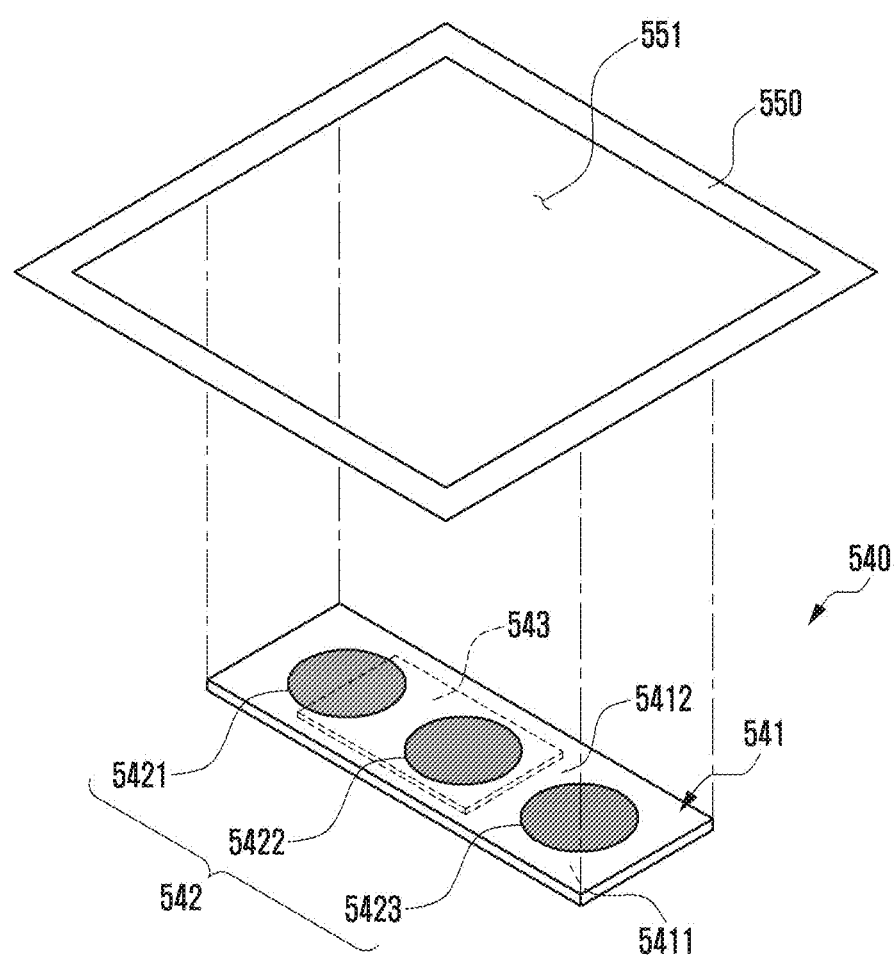
FIG. 6A is a perspective view illustrating an antenna module according to various embodiments of the disclosure.

FIG. 6A is a perspective view illustrating an antenna module according to various embodiments of the disclosure.

The antenna module 540 of FIG. 6A may be at least partially similar to the third antenna module 246 of FIG. 2 or may include other examples of the antenna module.

Referring to FIG. 6A, the antenna module 540 may include a substrate 541 including a first surface 5411 facing a first plate (e.g., the first plate 511 of FIG. 5) and a second surface 5412 opposite to the first surface 5411 and facing the second plate 512. According to one embodiment, the antenna module 540 may include a wireless communication circuit 543 disposed at the first surface 5411 of the substrate 541. According to one embodiment, the antenna module 540 may include an antenna array 542 including antenna elements 5421, 5422, and 5423 disposed at the second surface 5412 of the substrate 541 or disposed at regular intervals at a position adjacent to the second surface 5412 inside the substrate 541, and electrically connected to the wireless communication circuit 543. According to one embodiment, the antenna module 540 may include an antenna array 542 in which the antenna elements 5421, 5422, and 5423 have a 1×3 disposition structure. In another embodiment, the antenna module 540 may include an antenna array having a single antenna element, a 1×2 disposition structure, or a 1×N disposition structure having four or more of the N number of antenna elements. In another embodiment, the antenna array 542 may include an antenna array having a disposition structure of antenna elements of a multi-row and multi-column rather than one column. According to one embodiment, the antenna array 542 may include a sequentially disposed first antenna element 5421, second antenna element 5422, or third antenna element 5423. According to one embodiment, the antenna elements 5421, 5422, and 5423 may include a conductive patch disposed at the second surface 5412 of the substrate 541. According to one embodiment, the wireless communication circuit 543 may form a beam pattern in a designated direction (e.g., a second direction (②direction)) through the antenna elements 5421, 5422, and 5423.

According to various embodiments, the conductive structure 550 may be disposed at a position overlapped with the antenna module 540 when viewed from above the second plate (e.g., the second plate 512 of FIG. 5). According to one embodiment, the conductive structure 550 may include an opening 551 formed at a center thereof, and the antenna module 540 may be disposed at a position overlapped with the opening 551 when viewed from above the second plate 512, for example, at a position in which at least the entirety of the substrate 541 is overlapped with the opening 551.

Figure 6B:
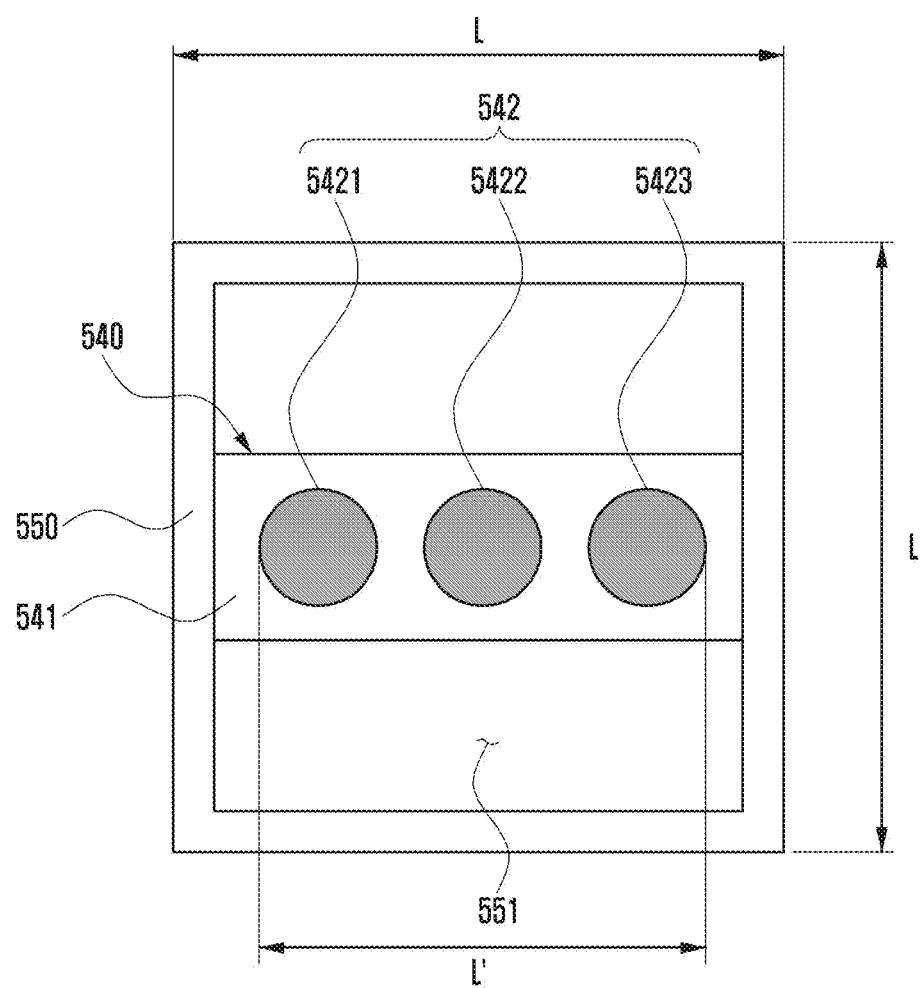
FIG. 6B is a diagram illustrating a disposition relationship of an antenna module and a conductive structure according to various embodiments of the disclosure.

FIG. 6B is a diagram illustrating a disposition relationship of an antenna module and a conductive structure according to various embodiments of the disclosure.

Referring to FIG. 6B, the antenna module 540 may include a substrate 541, and the substrate 541 may include a rectangular shape. According to one embodiment, the antenna module 540 may be disposed to overlap at least the opening 551 of the conductive structure 550 when viewed from above the second plate (e.g., the second plate 512 of FIG. 5). According to one embodiment, the opening 551 of the conductive structure 550 may be formed in a square having a length L of the long side of the substrate 541 of the antenna module 540 as one side. In another embodiment, the opening 551 may be formed in a square using a distance L' from the outermost edge end of the first antenna element 5421 to the outermost edge end of the third antenna element 5423 as one side.

Figure 7:
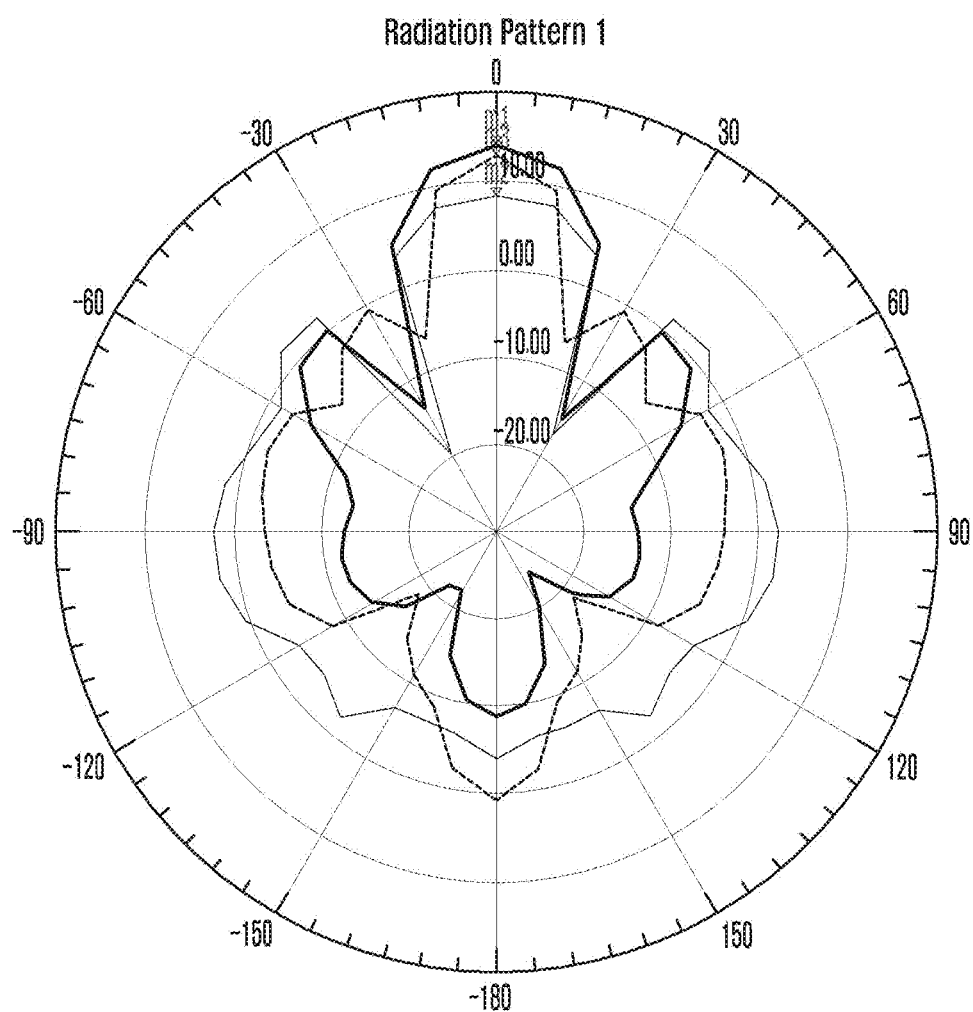
FIG. 7 is a diagram illustrating a radiation pattern of an antenna module of FIG. 5 according to various embodiments of the disclosure.

FIG. 7 is a diagram illustrating a radiation pattern of an antenna module according to various embodiments of the disclosure.

Referring to FIG. 7, M1 is a radiation pattern of the antenna module (e.g., the antenna module 540 of FIG. 5) when the second plate (e.g., the second plate 512 of FIG. 5) is omitted and illustrates that an optimal radiation performance is formed. M2 is a radiation pattern of the antenna module (e.g., the antenna module 540 of FIG. 5) when only the second plate (e.g., the antenna module 540 of FIG. 5) exists, and it illustrates that a radiation performance of the antenna module (e.g., the antenna module 540 of FIG. 5) is reduced by about 5.7 dB by the second plate 512 (e.g., the second plate 512 of FIG. 5) compared with M1. When viewed from above the second plate (e.g., second plate 512 of FIG. 5), in a case in which a conductive structure (e.g., the conductive structure of FIG. 5) disposed to overlap with the antenna module (e.g., the antenna module 540 of FIG. 5) is included, M3 is a radiation pattern of the antenna module (e.g., the antenna module 540 of FIG. 5) and illustrates that an excellent radiation performance is exhibited, as in the case of M1.

FIGS. 8A, 8B, 8C, 8D, and 8E are diagrams illustrating a disposition relationship in which conductive structures are disposed at a second plate according to various embodiments of the disclosure.

The second plate 800 of FIGS. 8A to 8E may be at least partially similar to the rear plate 311 of FIG. 3B or the second plate 512 of FIG. 5 or may include other examples of the second plate.

Figure 8A:
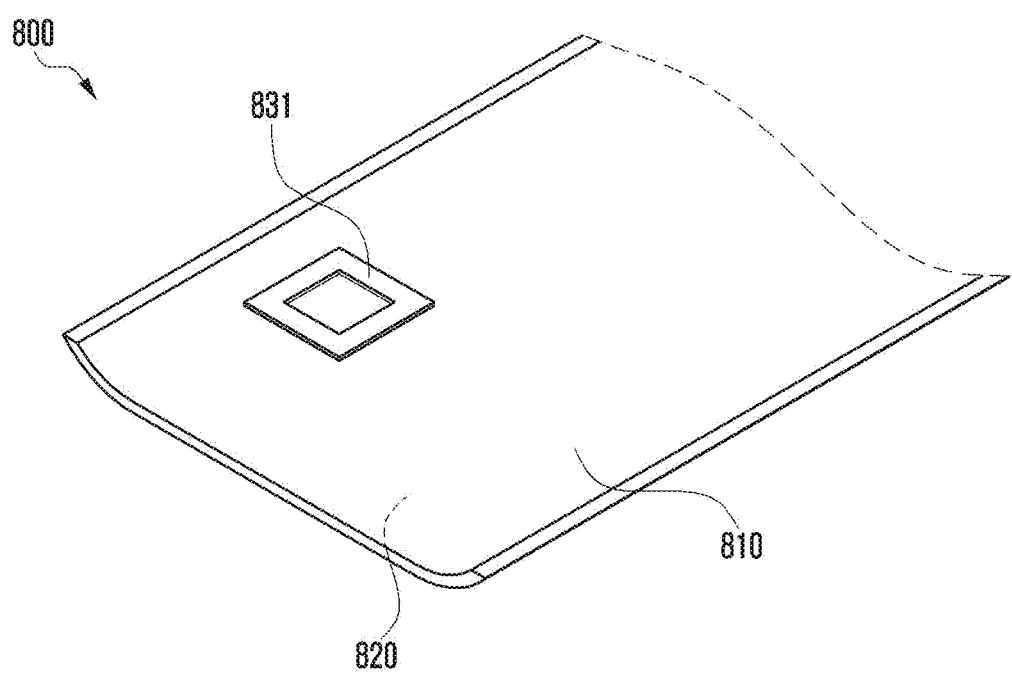
FIGS. 8A, 8B, 8C, 8D, and 8E are diagrams illustrating a disposition relationship in which a conductive structure is disposed at a second plate according to various embodiments of the disclosure.

Referring to FIG. 8A, the second plate 800 may include an inner surface 810 facing an inner space (the internal space 5101 of FIG. 5) of the electronic device (e.g., the electronic device 500 of FIG. 5) and an outer surface 820 facing the inner surface 810 and facing the outside of the electronic device (e.g., the electronic device 500 of FIG. 5). According to one embodiment, the conductive structure 831 may include a conductive plate attached to the inner surface 810 of the second plate 800. In another embodiment, the conductive structure 831 may include a FPCB including a conductive pattern attached to the inner surface of the second plate 800.

Figure 8B:
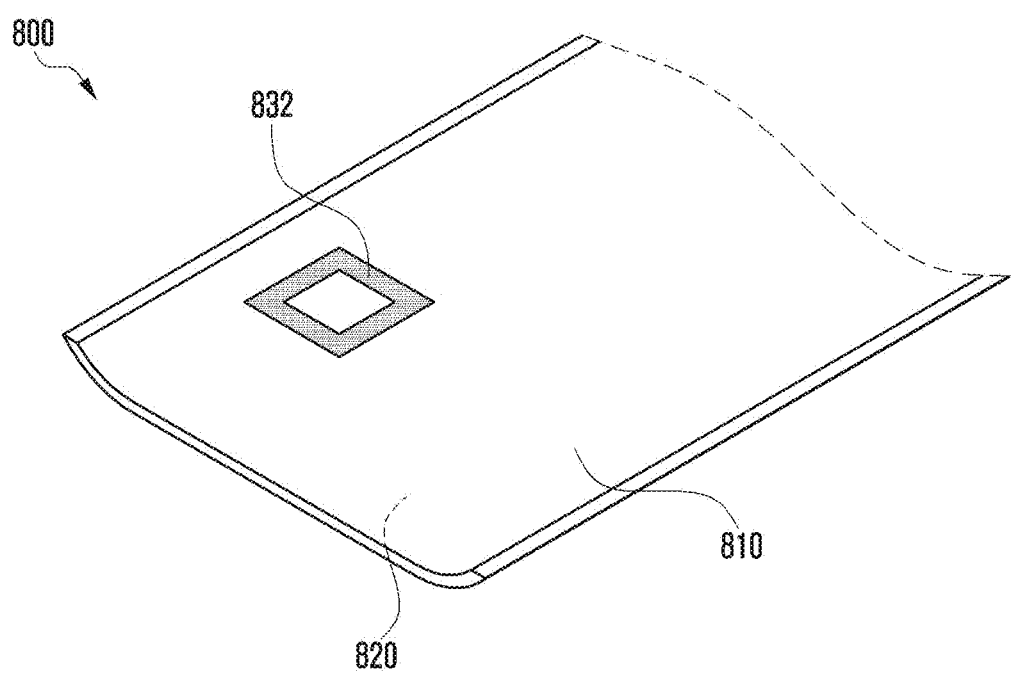

Referring to FIG. 8B, the conductive structure 832 may include a conductive paint applied to the inner surface 810 of the second plate 800. In one embodiment, the conductive structure 832 may include a conductive paint for shielding electromagnetic interference (EMI) applied to the inner surface 810 of the second plate 800. In another embodiment, the conductive structure 832 may include a laser direct structuring (LDS) pattern formed at the inner surface 810 of the second plate 800.

Figure 8C:
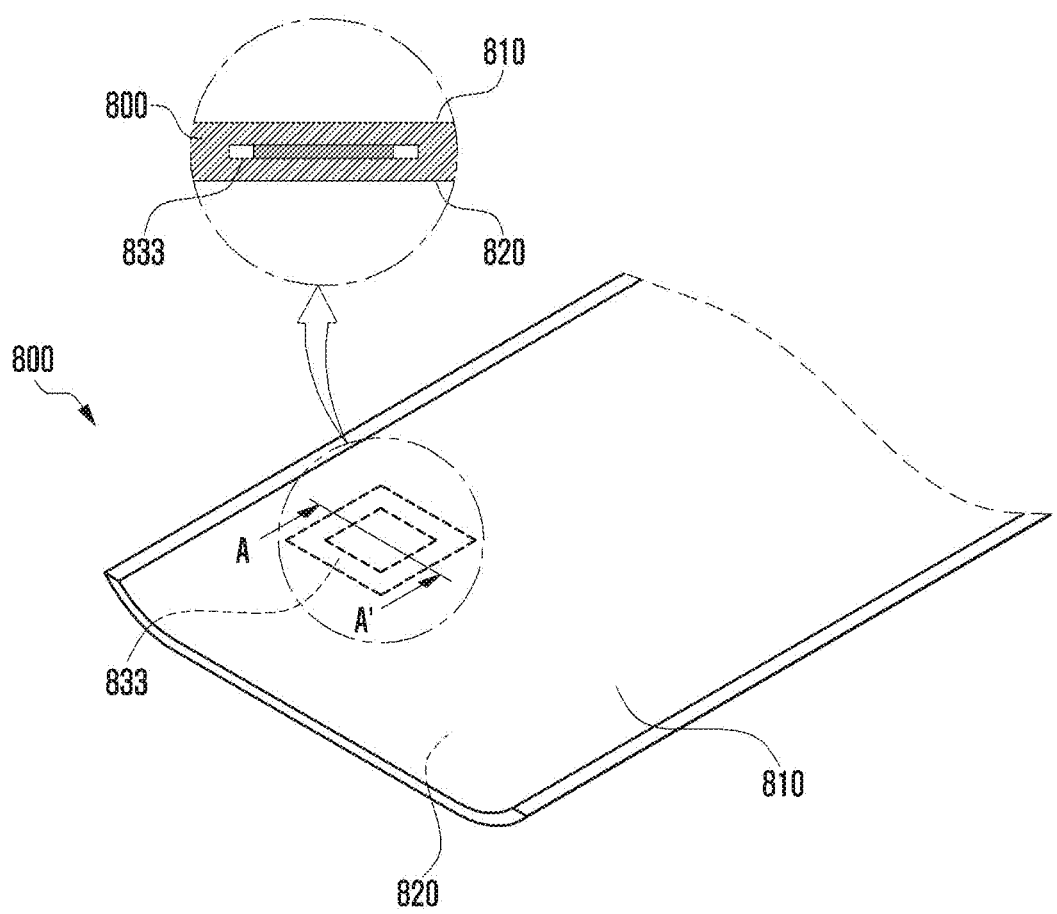

Referring to FIG. 8C and a partial cross-sectional view of the second plate 800 taken along line A-A' of FIG. 8C, the conductive structure 833 may include a conductive member (e.g., metal plate) embedded in a space between the inner surface 810 and the outer surface 820 of the second plate 800. In this case, the second plate 800 may include a polymeric material (e.g., polycarbonate (PC)), and the conductive member may be insert injected into the second plate 800.

Figure 8D:
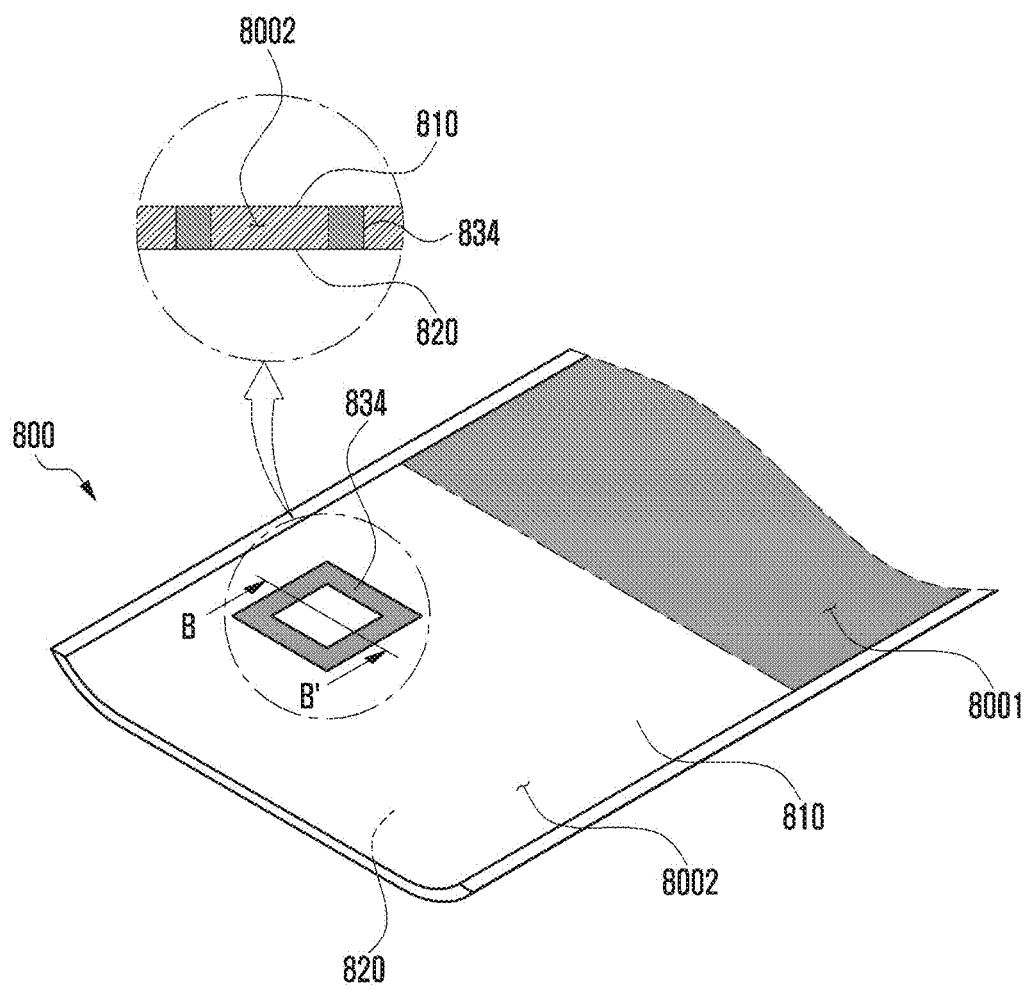

Referring to FIG. 8D and a partial cross-sectional view of the second plate 800 taken along line B-B' of FIG. 8D, the second plate 800 may include a conductive area 8001 (e.g., conductive member) and a non-conductive area 8002 (e.g., non-conductive member). According to one embodiment, the second plate 800 may be made of a heterogeneous material through double injection and/or insert injection of the conductive member and the non-conductive member. According to one embodiment, the conductive structure 834 may be disposed at a partial area of the non-conductive area 8002. According to one embodiment, the conductive structure 834 may be made of the same material as a conductive member of the conductive area 8001. In this case, because the conductive structure 834 is formed together when the second plate 800 is formed, a separate additional process is not required, and a mounting space for the conductive structure 834 may not be also required. Although not illustrated, as an opaque coating film is formed through a paint, the second plate 800 may be configured such that the conductive structure 834 is not visually distinguished, thereby contributing to improvement of the aesthetic sense of the electronic device.

Figure 8E:
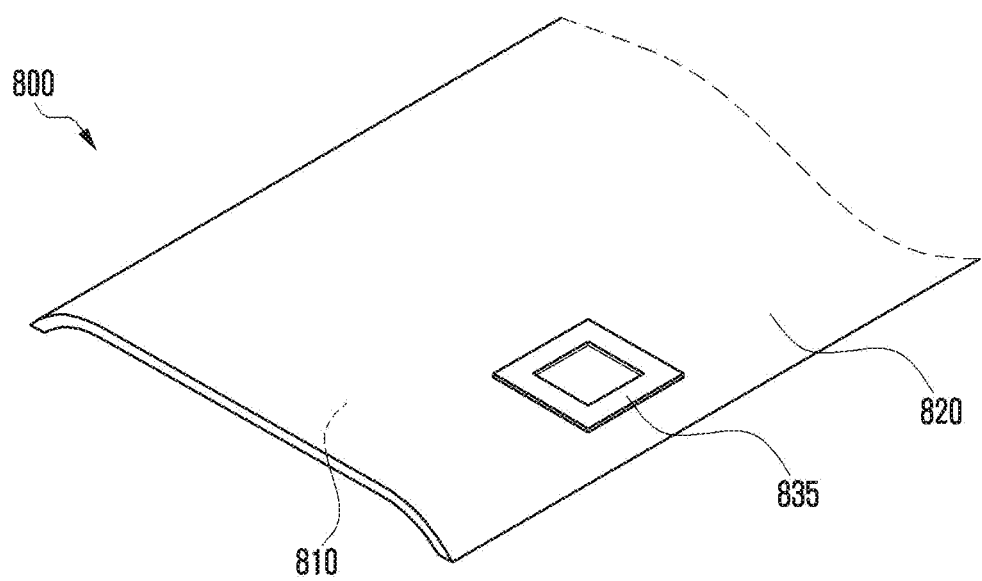

Referring to FIG. 8E, the conductive structure 835 may be replaced with a conductive decorative member disposed at an outer surface of the second plate 800. In this case, because the conductive structure 835 is not separately provided for improving a radiation performance of the antenna module (e.g., the antenna module 540 of FIG. 5), no additional process for the conductive structure 835 is required.

According to various embodiments of the disclosure, by only adding a relatively simple conductive structure, a radiation performance of an antenna module can be prevented from deteriorating; and, because no additional mounting space is required, the electronic device can have a slim thickness.

According to various embodiments, an electronic device (e.g., the electronic device 500 of FIG. 5) may include a housing (e.g., the housing 510 of FIG. 5) including a first plate (e.g., the first plate 511 of FIG. 5) facing in a first direction (e.g., a first direction (①) direction) of FIG. 5), a second plate (e.g., the second plate 512 of FIG. 5) opposite to the first plate and facing in a second direction (e.g., the second direction (②) direction) of FIG. 5), and a side member (e.g., the side member 513 of FIG. 5) enclosing a space (e.g., the internal space 5101 of FIG. 5) between the first plate and the second plate; an antenna structure (e.g., the substrate 541 of FIG. 5 or the antenna array 542 of FIG. 5) including at least one antenna element (e.g., the antenna array 542 of FIG. 5) disposed substantially parallel to the second plate in the space and disposed to face the second plate; a conductive structure (e.g., the conductive structure 550 of FIG. 5) disposed in the space and including an opening (e.g., the opening 551 of FIG. 5) and in which the antenna structure is disposed to at least partially overlap with at least the opening when viewed from above the second plate; and a wireless communication circuit (e.g., the wireless communication circuit 543 of FIG. 5) configured to at least partially form a directional beam through the at least one antenna element.

According to various embodiments, the wireless communication circuit (e.g., the wireless communication circuit 543 of FIG. 5) may be configured to transmit and/or receive a signal having a frequency of a range of about 3 GHz to 100 GHz through the at least one antenna element.

According to various embodiments, the opening (e.g., the opening 551 of FIG. 5) may be formed in a square having a length (e.g., the length L of FIG. 6B) of the longest side of the antenna structure as one side.

According to various embodiments, the antenna structure may include a substrate (e.g., 541 of FIG. 6A), the substrate may include a first surface (e.g., the first surface 5411 of FIG. 6A) facing in the first direction and a second surface (e.g., the second surface 5412 of FIG. 6A) opposite to the first surface and facing in a second direction, and the at least one antenna element may be disposed on the second surface or may be disposed adjacent to the second surface in an internal space between the first surface and the second surface.

According to various embodiments, the wireless communication circuit may be disposed on the first surface of the substrate.

According to various embodiments, the at least one antenna element may include a conductive patch disposed at the substrate.

According to various embodiments, the electronic device may further include a display (e.g., the display 520 of FIG. 5) disposed to be visible from the outside through at least a partial area of the first plate in the space.

According to various embodiments, an electronic device (e.g., the electronic device 500 of FIG. 5) may include a housing (e.g., the housing 510 of FIG. 5) including a first plate (e.g., the first plate 511 of FIG. 5) facing in a first direction (e.g., the first direction (①) direction) of FIG. 5), a second plate (e.g., the second plate 512 of FIG. 5) opposite to the first plate and facing in a second direction (e.g., the second direction (②) direction) of FIG. 5), and a side member (e.g., the side member 513 of FIG. 5) enclosing a space (e.g., the internal space 5101 of FIG. 5) between the first plate and the second plate; an antenna structure (e.g., the antenna module 540 of FIG. 5 and the antenna array 542 of FIG. 5) including a plurality of antenna elements (e.g., the antenna array 542 of FIG. 5) disposed substantially parallel to the second plate in the space and disposed to face the second plate; a conductive structure (e.g., the conductive structure 550 of FIG. 5) disposed through the second plate and including an opening and in which the plurality of antenna elements are disposed to at least partially overlap with at least the opening when viewed from above the second plate; and a wireless communication circuit (e.g., the wireless communication circuit 543 of FIG. 5) configured to at least partially form a directional beam through the plurality of antenna elements.

According to various embodiments, the wireless communication circuit may be configured to transmit and/or receive a signal having a frequency of a range of about 3 GHz to 100 GHz through the plurality of antenna elements.

According to various embodiments, the opening may be formed in a square having a length (e.g., the length L of FIG. 6B) of the longest side of the antenna structure as one side.

According to various embodiments, the opening may be formed in a square having a distance (e.g., the distance L' of FIG. 6B) between outermost edge portions of antenna elements facing each other as one side among the plurality of antenna elements.

According to various embodiments, the conductive structure (e.g., the conductive structure 831 of FIG. 8A) may be disposed at an inner surface (e.g., the inner surface 810 of FIG. 8A) of the second plate (e.g., the second plate 800 of FIG. 8A).

According to various embodiments, the conductive structure may include a FPCB including a conductive plate or a conductive pattern attached to an inner surface of the second plate.

According to various embodiments, the conductive structure (e.g., the conductive structure 832 of FIG. 8B) may include a conductive paint formed in an internal surface of the second plate.

According to various embodiments, the conductive structure (e.g., the conductive structure 833 of FIG. 8C) may include a conductive member embedded in a space between an inner surface and an outer surface of the second plate.

According to various embodiments, the conductive structure (e.g., the conductive structures 835 of FIG. 8E) may include a decorative member disposed at an outer surface of the second plate.

According to various embodiments, the second plate (e.g., the second plate 800 of FIG. 8D) may include a conductive area (e.g., the conductive area 8001 of FIG. 8D) including a conductive member and a non-conductive area (e.g., the non-conductive area 8002 of FIG. 8D) including a non-conductive member, and the conductive structure (e.g., the conductive structure 834 of FIG. 8D) may be disposed at the non-conductive area.

According to various embodiments, the conductive structure may be made of the same material as that of the conductive member in the non-conductive area and be formed together when the second plate is formed.

According to various embodiments, the electronic device may further include a display disposed to be visible from the outside through at least a partial area of the first plate in the space.

While the disclosure has been shown and described with reference to various embodiments of the disclosure thereof, it will be understood by those skilled in the art that various changes in form and details may be made therein without departing from the spirit and the scope of the disclosure as defined by the appended claims and their equivalents.

What is claimed is:

1. An electronic device, comprising:
   a housing comprising a first plate facing in a first direction, a second plate opposite to the first plate and facing in a second direction, and a side member enclosing a space between the first plate and the second plate;
   an antenna structure comprising:
      a substrate disposed substantially parallel to the second plate in the space; and
      at least one antenna element disposed on the substrate to face the second plate;
   a conductive structure disposed in the space and comprising an opening, the antenna structure being disposed to at least partially overlap the opening when viewed from above the second plate; and
   a wireless communication circuit configured to form a directional beam through the at least one antenna element,
   wherein the opening overlaps with at least the entirety of the substrate when viewed from above the second plate.

2. The electronic device of claim 1, wherein the wireless communication circuit is configured to transmit or receive signals having a frequency of 3 GHz to 100 GHz through the at least one antenna element.

3. The electronic device of claim 1, wherein the opening is formed in a square having a length of a longest side of the antenna structure.

4. The electronic device of claim 1,
   wherein the substrate comprises:
      a first surface facing in the first direction; and
      a second surface opposite to the first surface and facing in the second direction, and
   wherein the at least one antenna element is disposed on the second surface or is disposed adjacent to the second surface in an internal space between the first surface and the second surface.

5. The electronic device of claim 4, wherein the wireless communication circuit is disposed on the first surface of the substrate.

6. The electronic device of claim 4, wherein the at least one antenna element comprises a conductive patch disposed at the substrate.

7. The electronic device of claim 1, wherein the conductive structure is disposed at an inner surface of the second plate.

8. The electronic device of claim 1, further comprising a display disposed to be visible through at least a partial area of the first plate in the space.

9. An electronic device, comprising:
   a housing comprising a first plate facing in a first direction, a second plate opposite to the first plate and facing in a second direction, and a side member enclosing a space between the first plate and the second plate;
   an antenna structure comprising a plurality of antenna elements disposed substantially parallel to the second plate in the space and disposed to face the second plate;
   a conductive structure disposed through the second plate and comprising an opening, the plurality of antenna elements being disposed to at least partially overlap the opening when viewed from above the second plate; and
   a wireless communication circuit configured to form a directional beam through the plurality of antenna elements,
   wherein the opening overlaps with at least entirety of the plurality of antenna elements when viewed from above the second plate.

10. The electronic device of claim 9, wherein the wireless communication circuit is configured to transmit and/or receive signals having a frequency 3 GHz to 100 GHz through the plurality of antenna elements.

11. The electronic device of claim 9, wherein the opening is formed in a square having a length of a longest side of the antenna structure.

12. The electronic device of claim 9, wherein the opening is formed in a square having a distance between outermost edge portions of antenna elements facing each other among the plurality of antenna elements.

13. The electronic device of claim 9, wherein the conductive structure is disposed at an inner surface of the second plate.

14. The electronic device of claim 13, wherein the conductive structure comprises a flexible printed circuit board (FPCB) comprising a conductive plate or a conductive pattern attached to the inner surface of the second plate.

15. The electronic device of claim 13, wherein the conductive structure comprises a conductive paint formed in an internal surface of the second plate.

16. The electronic device of claim 9, wherein the conductive structure comprises a conductive member embedded between an inner surface and an outer surface of the second plate.

17. The electronic device of claim 9, wherein the conductive structure comprises a decorative member disposed on an outer surface of the second plate.

18. The electronic device of claim 9,
    wherein the second plate comprises a conductive area comprising a conductive member and a non-conductive area comprising a non-conductive member, and
    wherein the conductive structure is disposed on the non-conductive area.

19. The electronic device of claim 18, wherein the conductive structure is made of the same material as the conductive member in the non-conductive area and is formed together when the second plate is formed.

20. The electronic device of claim 9, further comprising a display disposed to be visible through at least a partial area of the first plate in the space.

\* \* \* \* \*